United States Patent
Sinanoglu

(10) Patent No.: US 10,203,368 B2
(45) Date of Patent: Feb. 12, 2019

(54) SYSTEMS, PROCESSES AND COMPUTER-ACCESSIBLE MEDIUM FOR PROVIDING A BI-DIRECTIONAL SCAN PATH FOR PEAK CAPTURE POWER REDUCTION IN LAUNCH-OFF-SHIFT TESTING

(71) Applicant: New York University, New York, NY (US)

(72) Inventor: Ozgur Sinanoglu, Abu Dhabi (AE)

(73) Assignee: New York University, New York, NY (US)

( * ) Notice: Subject to any disclaimer, the term of this patent is extended or adjusted under 35 U.S.C. 154(b) by 1705 days.

(21) Appl. No.: 13/735,679

(22) Filed: Jan. 7, 2013

(65) Prior Publication Data

US 2013/0185014 A1    Jul. 18, 2013

Related U.S. Application Data

(60) Provisional application No. 61/583,924, filed on Jan. 6, 2012.

(51) Int. Cl.
*G01R 31/28*     (2006.01)
*G01R 31/3185*  (2006.01)

(52) U.S. Cl.
CPC ..... *G01R 31/28* (2013.01); *G01R 31/318575* (2013.01); *G01R 31/318558* (2013.01)

(58) Field of Classification Search
CPC .................................................... G01R 31/28
See application file for complete search history.

(56) References Cited

U.S. PATENT DOCUMENTS

| | | | | |
|---|---|---|---|---|
| 5,535,331 | A * | 7/1996 | Swoboda | G06F 15/786 712/E9.016 |
| 2005/0278368 | A1* | 12/2005 | Benedikt | G06F 17/30914 |
| 2007/0011542 | A1* | 1/2007 | Mukherjee | G01R 31/318541 714/738 |
| 2008/0036505 | A1* | 2/2008 | Kato | G01B 31/318536 327/16 |
| 2010/0278340 | A1* | 11/2010 | Yajima | H04L 9/0625 380/255 |
| 2012/0239995 | A1* | 9/2012 | Gizdarski | G01R 31/318547 714/729 |

OTHER PUBLICATIONS

Xu et. al., "Pattern-Directed Circuit Virtual Partitioning for Test Power Reduction", International Test Conference, pp. 1-10.*

(Continued)

*Primary Examiner* — John Breene
*Assistant Examiner* — Yaritza H Perez Bermudez
(74) *Attorney, Agent, or Firm* — Hunton Andrews Kurth LLP

(57) ABSTRACT

Exemplary systems, methods and computer-readable mediums can assign, from the circuit, at least two scan cells as at least two interface registers, and generate at least one bidirectional scan path between the at least two interface registers of the at least one portion of the circuit. The at least two interface registers can be disposed in neighboring positions, and the assigning can include a partitioning procedure that can iteratively merge the scan cells of the at least one portion of the circuit into a plurality of regions.

14 Claims, 6 Drawing Sheets

ATPG model and actual scan architecture for low-power LOS testing

(56) References Cited

OTHER PUBLICATIONS

Savir et al. "On broad-side delay test," IEEE Transactions on Very Large Scale Integration (VLSI) Systems, vol. 2, No. 3, pp. 368-372, 1994.
Savir et al. "Scan-based transition test," IEEE Transactions on Computer-Aided Design of Integrated Circuits and Systems, vol. 12, No. 8, pp. 1232-1241, Aug. 1993.
P. Girard "Survey of low-power testing of VLSI circuits," IEEE Design and Test, vol. 19, No. 3, pp. 82-92, 2002.
P. Girard et al. "Power-aware testing and test strategies for low power devices," in Springer, 2010.
Saxena et al. "A case study of IR-drop in structured at-speed testing," in International Test Conference, pp. 1098-1104, 2003.
Butler et al. "Minimizing power consumption in scan testing: Pattern generation and DFT techniques," in International Test Conference, 2004, pp. 355-364.
Agarwal et al. "Power analysis and reduction techniques for transition fault testing," in Asian Test Symposium, 2008, pp. 403-408.
Chakravadhanula et al. "Capture power reduction using clock gating aware test generation," in International Test Conference, 2009, pp. 1-9.
Zhang et al. "Enhancing delay fault coverage through low power segmented scan," in European Test Symposium, May 2006, pp. 21-28.
Xu et al. "Pattern-directed circuit virtual partitioning for test power reduction," in International Test Conference, 2007, pp. 1-10.
Moghaddam et al. "At-speed scan test with low switching activity," in VLSI Test Symposium, 2010, pp. 177-182.
Dilillo et al. "Power reduction through x-filling of transition fault test vectors for los testing," in International Conference on Design and Test of Integrated Systems, 2011.
P. Girard et al. "Circuit partitioning for low power BIST design with minimized peak power consumption," in Asian Test Symposium, 1999, pp. 89-94.
Ho Fai Ko et al. "Rtl scan design for skewed-load at-speed test under power constraints," in International Conference on Computer Design, 2006, pp. 237-242.
Ho Fai Ko et al. "Automated scan chain division for reducing shift and capture power during broadside at-speed test," IEEE, vol. 27, No. 11, pp. 2092-2097, 2008.
Chen et al. "Mvp: Capture-power reduction with minimum-violations partitioning for delay testing," in International Conference on Computer-Aided Design, 2010, pp. 149-154.
Ahmed et al. "Local at-speed scan enable generation for transition fault testing using low-cost testers," IEEE, vol. 26, No. 5, pp. 896-906, May 2007.
Xu et al. "Scan cell design for launch-on-shift delay tests with slow scan enable," IET Computers Digital Techniques, vol. 1, No. 3, pp. 213-219, May 2007.
Wu et al. "Analysis of power consumption and transition . . . " in International Symposium on Design and Diagnostics of Electronic Circuits and Systems, 2010, pp. 376-381.
Karypis et al. "Multilevel hypergraph partitioning Applications in vlsi domain," in Technical Report, Department of Computer Science, University of Minnesota, 1998.
Sankaralingam et al. "Reducing power dissipation during test using scan chain disable," in VLSI Test Symposium, 2001, pp. 319-324.

\* cited by examiner

LOC and LOS testing schemes

Launch-capture clock staggering
(two regions) with rewind support

Figure 4. Partitioning algorithm driven by iterative merge of SCCs

SYSTEMS, PROCESSES AND COMPUTER-ACCESSIBLE MEDIUM FOR PROVIDING A BI-DIRECTIONAL SCAN PATH FOR PEAK CAPTURE POWER REDUCTION IN LAUNCH-OFF-SHIFT TESTING

CROSS-REFERENCE TO RELATED APPLICATIONS

This application relates to and claims priority from U.S. Application No. 61/583,924, filed on Jan. 6, 2012, the entire disclosure of which is incorporated herein by reference.

FIELD OF THE DISCLOSURE

Exemplary embodiments of the present disclosure relate to testing of integrated circuits, and more specifically, to systems, methods and computer-accessible mediums for providing partitioned testing of integrated circuits.

BACKGROUND INFORMATION

Deep sub-micron effects can be magnified by shrinking feature sizes, which can result in integrated circuits being prone to timing-related defects. Accordingly, stringent test quality requirements have favored the use of at-speed testing procedures in addition to traditional static test procedures that target stuck-at faults. While at-speed functional patterns used to be an alternative in targeting timing-related defects, increasing design complexity has hampered the generation and utilization of functional patterns, which has instead favored the use of scan-based structural at-speed testing techniques.

In full-scan designs, a structural at-speed pattern can be loaded into the scan cells via scan operations, and subsequently, applied to the circuit. As the targeted defects can be timing-related, these patterns typically check whether transitions launched from scan cells can arrive at their destinations (e.g., scan cells) within a functional clock period.

There are generally two different schemes for launching transitions off a serially loaded pattern. In launch-off-capture ("LOC" or broadside) test (see, e.g., Reference 1), a functional capture operation typically launches transitions from the locations where the serially loaded pattern V1 differs from the response of the combinational logic to V1 (e.g., the launch pattern V2). In launch-off-shift ("LOS" or skewed-load) test (see, e.g., Reference 2), a single-cycle shift operation typically launches transitions from the locations where the serially loaded pattern V1 differs from its one-bit shifted version (e.g., the launch pattern V2 ). In both schemes, a subsequent fast functional capture operation, which can be of a functional clock period apart from the launch event, can set a deadline for the transitions to arrive at their destinations. A timing-related defect that slows down the chip below its rated clock speed can therefore be exposed. Neither scheme is generally capable of bringing any arbitrary launch pattern V2 into the scan cells due to the constraint in which the launch pattern can be generated out of the serially loaded pattern V1. Transition fault or path delay coverage loss can ensue as a result.

Serial shift operations during a scan can result in excessive switching activity in the scan chains, which can propagate into the combinational logic, and which can further unnecessarily dissipate dynamic power in both static and at-speed testing schemes. The end-result, unless treated properly, can be an unexpected behavior of the design, thereby resulting in, for example, a yield loss or reliability problems. Elevated levels of peak power, which can be the maximum instantaneous power throughout the entire test process, can be the cause of the former problem, while the underlying reason for the latter problem can be average power, which can be the total power dissipation averaged over the duration of the test application process. (See, e.g., References 3, 4). As the test application process is typically dominated by shift operations, average power can mostly depend on shift power, and thus, the impact of capture power on average power can generally be negligible. Capture power, however, can typically be more of a concern when peak power is the targeted issue.

Yield loss problem can be further exacerbated in at-speed testing schemes. (See, e.g., References 5, 6). Excessive switching activity during the launch cycle can result in elevated peak supply currents, which can lead to IR drop that can increase signal propagation delays in the combinational logic. The end-effect may not be differentiated from that of a timing-related defect, causing a functional chip to fail the at-speed test. Peak power during the launch cycle of at-speed testing can be preferably reduced in order to avoid the yield loss induced by IR drop.

Some research effort has been performed in order to reduce power dissipation during the launch and capture of at-speed testing; these techniques generally target the LOC scheme. Test pattern generation, while accounting for the functional clock gating logic in order to produce patterns that disable parts of the design during launch and capture, has been proposed (see, e.g., References 7, 8) in order to reduce peak power at the expense of pattern count inflation. Another approach that elevates pattern count while reducing peak launch power has been in the form of generating patterns under the constraint that only one chain launches transitions while all chains capture. (See, e.g., Reference 9). A partitioning approach has been proposed (see, e.g., Reference 10), where power-wise costly patterns are further analyzed via fault simulation to identify the location of the care bits, which dictates the partitioning of the design during capture; with few problematic patterns. Such an approach can deliver power savings, albeit at the expense of ancillary defect coverage loss as the analysis can be fault model dependent. A judicious x-fill approach driven by an analysis of the responses repetitively produced by the combinational logic has been proposed (see, e.g., Reference 11); as with other x-fill approaches, pattern count inflation can be the side effect. Another x-fill approach (see, e.g., Reference 12) can retain pattern count and fault coverage, however, it cannot guarantee the same level of defect coverage. Partitioning the design, and testing one partition at a time, has been proposed to reduce launch and capture power in BIST (see, e.g., Reference 13), in LOS (see, e.g., Reference 14), and in LOC (see, e.g., Reference 15) testing schemes. In these schemes, newly generated patterns targeting one partition at a time typically end up loading the interface registers of other partitions as well, incurring test time and data volume penalty. A similar end-result has been experienced even when the design can be partitioned via ILP that minimizes capture violations (see, e.g., Reference 16). For such violations, additional test patterns, possibly of a high sequential depth, are typically need to be generated so as to cover the faults missed due to capture violations, while possibly leaving some of the unmodeled defects uncovered.

While LOC can attain lower fault coverage levels compared to LOS, both schemes can suffer from over-testing of chips as they can lead the design to a functionally unreachable state upon loading a pattern. Additionally, LOS suffers more from over-testing, as the launch event can also be performed via a shift operation, which can be non-functional at higher run-times, as the identification of the proper V1-V2 pair typically requires two-time-frame test generation as opposed to a simpler single-bit shift relation between V1 and V2. Therefore, the LOS scheme can pose challenges. For example, in LOS, the scan-enable signal can switch from HIGH (shift mode) to LOW (capture mode) at-speed, and can be treated as a fast clock signal during timing closure. This problem can be alleviated however by proposed solutions. (See, e.g., References 17, 18). Additionally, as LOS can be capable of launching more transitions compared to LOC, which can be one of the reasons why LOS can deliver a higher coverage, power dissipation of LOS in the launch cycle can be higher than that in LOC. (See, e.g., References 7, 19).

Accordingly, there may be a need to address at least some of the above-described deficiencies.

SUMMARY OF EXEMPLARY EMBODIMENTS

Exemplary embodiments of the present disclosure can provide a test power reduction framework for LOS-based at-speed testing. According to certain exemplary embodiments of the present disclosure, design partitioning systems, methods and computer-accessible mediums can be provided that can reduce power dissipation during launch and capture operations in LOS testing. Certain exemplary embodiments of the present disclosure can re-use the patterns generated (and optimized for pattern count and quality) by a conventional power-unaware LOS ATPG tool intact, and yet apply them in a low power manner, a feature that other partitioning solutions fail to deliver. This way, not only pattern count and test quality (e.g., fault and ancillary defect coverage) can be retained intact, but also test generation process can be neither modified nor repeated. Certain exemplary embodiments of the present disclosure can provide a unique procedure in reducing launch/capture power while retaining pattern count and test quality intact. According to certain exemplary embodiments of the present disclosure, certain challenges in implementing launch and capture clock staggering techniques with LOS testing can be identified and addressed. Additionally, according to certain exemplary embodiments, partitioning rules (as well as the timing-wise non-intrusive MT support to facilitate transform power-thriftless patterns into power-frugal ones) can be provided.

These and other objects, features and advantages of the exemplary embodiment of the present disclosure will become apparent upon reading the following detailed description of the exemplary embodiments of the present disclosure, when taken in conjunction with the appended claims.

BRIEF DESCRIPTIONS OF THE DRAWINGS

Further objects, features and advantages of the present disclosure will become apparent from the following detailed description taken in conjunction with the accompanying Figures showing illustrative embodiments of the present disclosure, in which.

Figure 1:
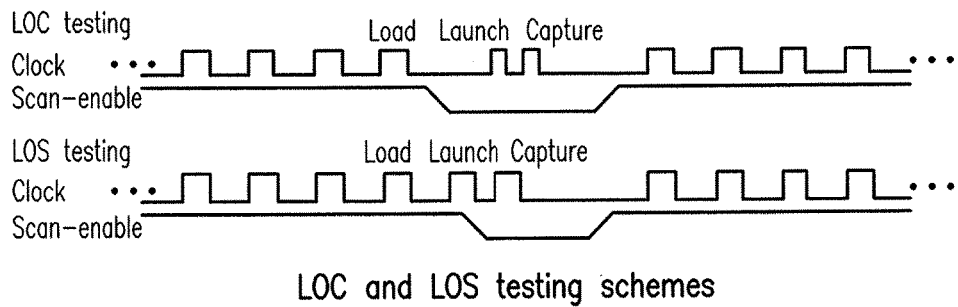
FIG. 1 is an illustration of an exemplary clocking of exemplary LOS and LOC patterns.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures, and exemplified in the claims provided herein.

DETAILED DESCRIPTION OF EXEMPLARY EMBODIMENTS

Exemplary Low-Power LOS Test
Exemplary at-Speed Testing Preliminaries

FIG. 1 illustrates an exemplary clocking of exemplary LOC and LOS patterns. In LOC testing, the pattern that launches (e.g., the launch) transitions can be obtained during the capture window from the pattern that had been shifted in via scan operations (e.g., the load). The identification of the proper load pattern therefore typically requires a logic-depth-2 test generation. In LOS testing, on the other hand, the launch pattern can be obtained from the load pattern via a shift operation.

Exemplary Challenges/Solutions in Implementing Partitioning-based Power Reduction Techniques with at-speed Testing Schemes There can be certain challenges in reducing launch and capture power in LOS testing, while applying intact the patterns generated by a power-unaware ATPG tool. A challenge in implementing such a technique in at-speed testing can be that assumptions are typically not made regarding which pattern targets which transition faults, or from which scan cells the transitions are launched. Nevertheless, the exemplary systems, methods and computer-accessible mediums can provide the same fault and defect coverage by applying the same set of patterns, yet in a low power fashion.

Testing one region at a time in at-speed testing can require launching and capturing transitions within one region at a time; delivering savings in launch and capture power. While in static testing, capture staggering opposite in the direction of data flow has been shown to facilitate application of test patterns intact (see, e.g., Reference 20), the launch operation can impose additional constraints and can necessitate further DfT support in partition-based at-speed testing. The exemplary systems, methods and computer-accessible mediums can address these challenges in LOS testing.

Typically, registers, upon being loaded, can first move to the launch state (e.g., a single-cycle shift operation) and subsequently to the capture state. Once the registers of a region/partition capture, they can typically no longer go back to the launch state. Therefore, the constraint of "launch/ capture order opposite in the direction of data flow" generally applies to at-speed testing also. A region that drives no other region but itself can perform the launch and capture prior to other regions, whose test follows subsequently. To identify the design regions, and thus the scan cell groups properly, the s-graph (in an s-graph, the nodes denote the flip-flops, and a directed edge from node a to node b denotes a combinational path from flip-flop a to flip-flop b) of the design can be partitioned into Strongly-Connected-Components ("SCCs"). (See, e.g., Reference 20). An SCC can be a group of nodes where each node within the SCC can be reachable from every other node in the SCC. Typically, an s-graph partitioned into SCCs contains no cycles, delivering the unidirectionality needed to avoid capture violations.

As an example of the above, suppose a region $R_A$ (e.g., one or more SCCs) drives another region $R_B$, which can be tested. In order to test $R_B$ properly with a given pattern, launch operation preferably take place not only in $R_B$ (e.g., to test the internal paths in $R_B$), but also in the other regions that drive $R_B$, including $R_A$. This generally requires the load of the registers of $R_A$ (e.g., those which drive $R_B$ through combinational paths, namely, interface registers of $R_A$), and performing a launch in these registers with no capture. A capture operation subsequent to launch can be performed only in $R_B$. While this can assist in completing the test of $R_B$, the interface registers of $R_A$ may have already launched transitions, and can now be moved to the launch state. These interface registers can launch transitions again when $R_A$, or any other region that can be driven by the interface registers of $R_A$, is being tested!

According to certain exemplary embodiments of the present disclosure, in LOS testing, a simple DfT support can undo the move from the load state to launch state, as launch operation can be in the form of a simple single-cycle shift operation. A single-cycle shift in the reverse direction can restore the load state, enabling future launch operations from the interface registers that already performed launch earlier. Upon loading registers of $R_A$, and launching transitions from these registers to test $R_B$, this single-cycle undo or rewind operation can restore the load state in $R_A$ interface registers, enabling the subsequent test of $R_A$, for instance.

As with any DfT support, this capability can come at a cost. Furthermore, the minimization of power dissipation during launch operations can also favor the minimization of the registers that can be clocked during launch. Due to these two reasons, the number of interface registers in a region that can get involved to test a successor region can be minimized. Certain exemplary embodiments of the present disclosure which can provide the DfT support and the partitioning procedure that facilitates achieve this goal are described in further detail herein below.

According to certain exemplary embodiments of the present disclosure, power savings during launch and capture in LOS testing via partitioning can be attained while being able to apply the patterns of a power-unaware ATPG tool, for example:

if regions are preferably tested in an order opposite to the data flow,
if region interface registers can be rewound upon launch.

Exemplary Testing Framework

Figure 2:
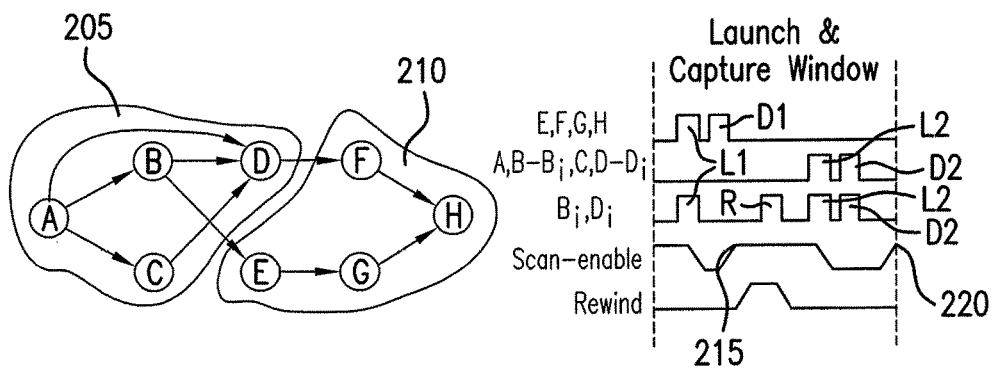
FIG. 2 is an illustration of an exemplary testing framework and diagram according to certain exemplary embodiments of the present disclosure.

An exemplary low-power LOS testing framework according to certain exemplary embodiments of the present disclosure is shown in FIG. 2, where the eight SCCs shown in the same figure are partitioned, for example, into two regions (A, B, C, D) and (E, F, G, H) during launch and capture operations. According to other exemplary embodiments of the present disclosure, various numbers of SCCs can be partitioned into any number of regions. Upon the completion of load operations, the region (E, F, G, H) can be tested first by launching transitions from not only the registers in this region, but also the interface registers from the other regions that feed this region. For example, $B_i$ and $D_i$ can denote the set of interface registers in SCCs B and D that combinationally feed the registers in SCCs E and F. By launching transitions from (E, F, G, H), $B_i$ and $D_i$ and by capturing in (E, F, G, H), this region (E, F, G, H) can be tested by the test pattern, although a given pattern may not launch any transitions from, for example, $D_i$, the exemplary scheme can clock the possible transition source registers during launch, ensuring the detection of faults and defects that the pattern targets, for example, regardless of where the transitions are launched.

Upon the completion of the test of the first region, the launch operation in the interface registers $B_i$ and $D_i$ can be undone through the use of a rewind signal. For example, when this signal can be asserted (e.g., for a single cycle), the interface registers can shift in the reverse direction for a single cycle, restoring their load state. Now that the interface registers are ready for launching transitions again, the test of the second region (e.g., A, B, C, D) can proceed. The registers in this region can now launch and capture.

According to the exemplary embodiments of FIG. 2, launch and capture power can be reduced due to staggering of the clocks. In this example, launch can be performed in either ($B_i$, $D_i$, E, F, G, H) or in (A, B, C, D). Capture can be conducted in one region at a time, which can be either in (A, B, C, D) or in (E, F, G, H).

Further reductions in launch and capture power can be attained by partitioning the registers into a larger number of regions during launch and capture. In such a case, upon the test of the regions except for the last one, a single-cycle rewind operation can be conducted in the interface registers in which launch operations were performed. The capture windows can be extended to accommodate for the additional rewind and launch-capture operations, which can reflect a slight test time increase per pattern. The number of scan cells in the largest region can determine the reduction attained in capture power, while the number of interface registers feeding a region along with the registers in that region can determine the reduction in launch power, and can be represented, for example, as the following:

$$ELPR_{LOS} = \frac{\# \text{ scan cells}}{\max_{r \in regions} \left\{ |r| + \sum_{p \in pred(r)} |p_i| \right\}}$$

$$ECPR_{LOS} = \frac{\# \text{ scan cells}}{\max_{r \in regions} |r|},$$

where pred(r) can denote the set of regions that combinationally feed region r, $|p_i|$ can denote the number of interface registers in region p, and $ELPR_{LOS}$ and $ECPR_{LOS}$ can denote the expected power reductions during launch and capture in LOS testing, respectively. The partitioning of the design can dictate the expected power reductions during launch and capture.

Exemplary DfT Support and Implementation

As the LOS scheme launches transitions via a shift operation, a set of test patterns can be valid as long as the final scan cell ordering in the chain matches the test pattern during test generation. Therefore, LOS pattern generation can be done subsequent to scan stitching in conventional LOS.

An additional constraint imposed on scan stitching by the exemplary partitioning procedure can be that the interface registers of each region can be placed in consecutive positions on the scan chain, and that they can be in a bi-directional manner. Such a special stitching, and the associated DIT support, can be preferred for the interface registers in order to enable a proper rewind operation; minimization of the number of interface registers can facilitate minimizing the area cost incurred. Additionally, restoring the value of the rightmost bit of a group of interface registers subsequent to the launch operation can necessitate an extra flip-flop, which can hold the value of the rightmost interface bit upon launch. A subsequent rewind operation can restore the value of the rightmost interface register from the value in this extra flip-flop. The rewind signal can be easily generated on-chip (e.g., by using a simple circuitry with, for example, two flip-flops in total, as described below) subsequent to each launch-capture clock pulse pair in any region, which can be when the load state of interface registers are preferably restored. As there can be no timing requirement on the rewind signal (e.g., rewind operation can be done any time after launch-capture), timing closure for this signal generally requires minimal effort. Furthermore, no additional pin can be required for this signal.

An exemplary bidirectional stitching of the interface registers in a region can require an additional multiplexer for each interface register. This multiplexer can be inserted on the scan path (e.g., on the 1-input of the scan multiplexer), imposing no impact on the functional timing of the design.

An exemplary LOS pattern generation can be performed on a design with its scan chain stitched in a conventional manner, without the exemplary partitioning (e.g., double-stitching) procedures. This way, a power-unaware ATPG can be used to generate the LOS patterns. As long as double-stitching to the consecutively positioned interface registers can be in place (e.g., enabling rewind operation), launch-capture staggering of regions in an opposite direction to the data flow can facilitate the application of the patterns to be generated by the power-unaware ATPG tool.

Figure 3:
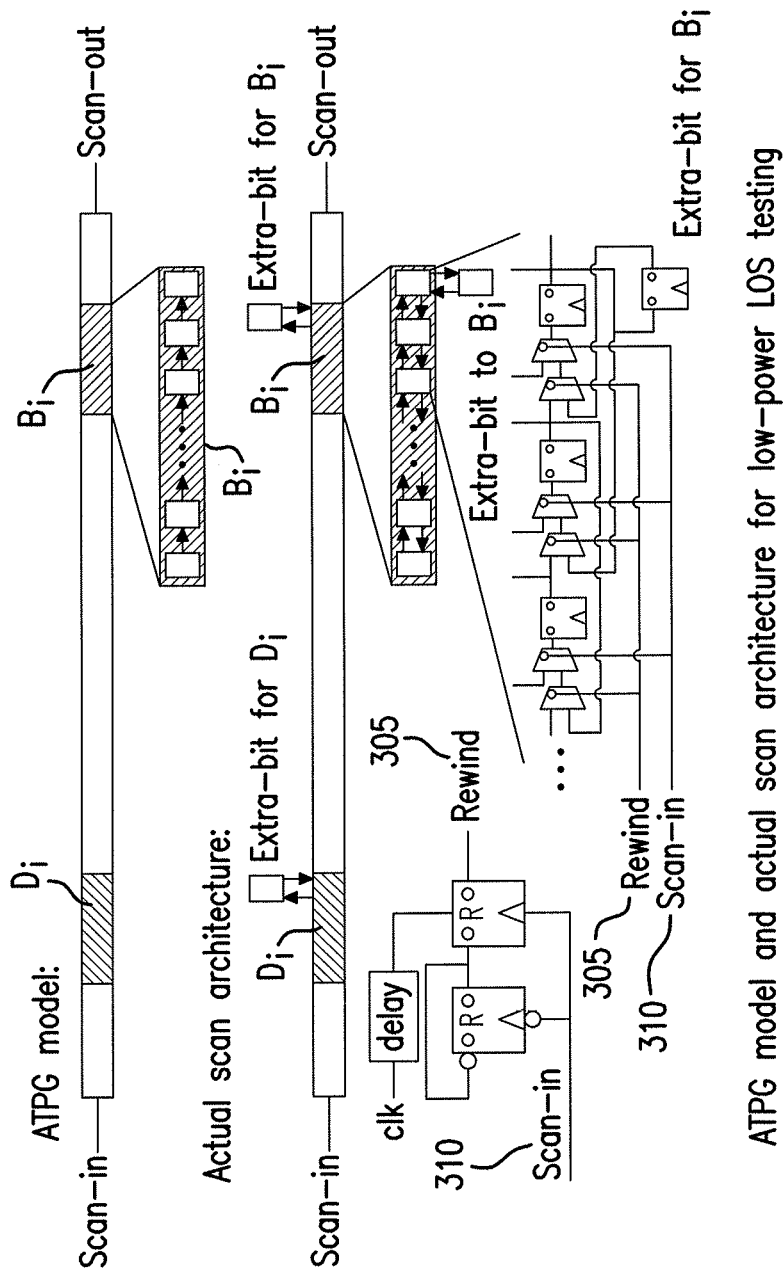
FIG. 3 is a schematic diagram of an exemplary testing architecture according to certain exemplary embodiments of the present disclosure.

The exemplary scan architecture that can support design partitioning into two regions (e.g., following the example shown in FIG. 2) is illustrated in FIG. 3, which also illustrates the simple and cost-effective on-chip generation of the rewind signal out of the scan-enable signal. The first rising edge of the scan-enable signal can set the rewind signal and the first active clock can reset it, while it remains reset upon the second rising edge of the scan-enable signal. Double-stitched interface registers in $B_i$ and $D_i$ through the insertion of one multiplexer per interface register, two test-only flip-flops (e.g., same as the number of regions with interface registers) to hold the rightmost bit of the two interface register groups and two flip-flops that help generate the rewind signal can enable the exemplary design partitioning operation. The total cost can be, for example, $N_{int}$ MUXes and $R_{int}+2$ flip-flops for $N_{int}$ interface registers and $R_{int}$ regions that has at least one interface register. Logic can be inserted on the scan path, and can impose no delay on any functional path in the design. As FIG. 3 also shows, test generation can be done in a manner oblivious to the proposed architectural changes, and the interface registers can be positioned together during ATPG for valid pattern generation.

Exemplary Design Partitioning Procedure

Exemplary systems, methods and computer-accessible mediums can provide an exemplary partitioning procedure for staggering launch-capture clocks of the regions. This partitioning procedure can be driven by a constraint and two conflicting optimization criteria. The constraint can be that the regions should not form any cycle so that a launch-capture clock ordering in the opposite direction of the data flow can be pursued. The two optimization criteria can be, for example: (1) minimization of launch and capture power, and (2) minimization of interface registers so as to minimize area cost.

The constraint can be met by identifying the strongly connected components of the s-graph of the design in a manner similar to the low power static test approach (see, e.g., Reference 20). The resulting graph, where each SCC corresponds to a region, can be acyclic (length-1 cycles, namely, loops, can be allowed, as they pose no problems: the internal paths within a region can be tested during the test of that region in any case, therefore, the loops can be safely omitted from the SCC-graph during the partitioning analysis), enabling the levelization of the graph, and thus the identification of the region order that can be opposite to the direction of the data flow. A high-granularity design partitioning (e.g., a large number of regions) can deliver maximal savings in launch and capture power, as regions along with the interface registers that drive them can be small-sized. On the flip side, the total number of interface registers can be excessive as there can be a large number of edges in the graph.

The two conflicting goals of minimizing launch-capture power and minimizing area cost can be best handled through a procedural framework that can enable power-area co-optimizations. In a realistic scenario, either maximum reduction in launch and capture power can be aimed under an area constraint, or a particular power reduction level can be targeted via minimal area cost.

Figure 4:
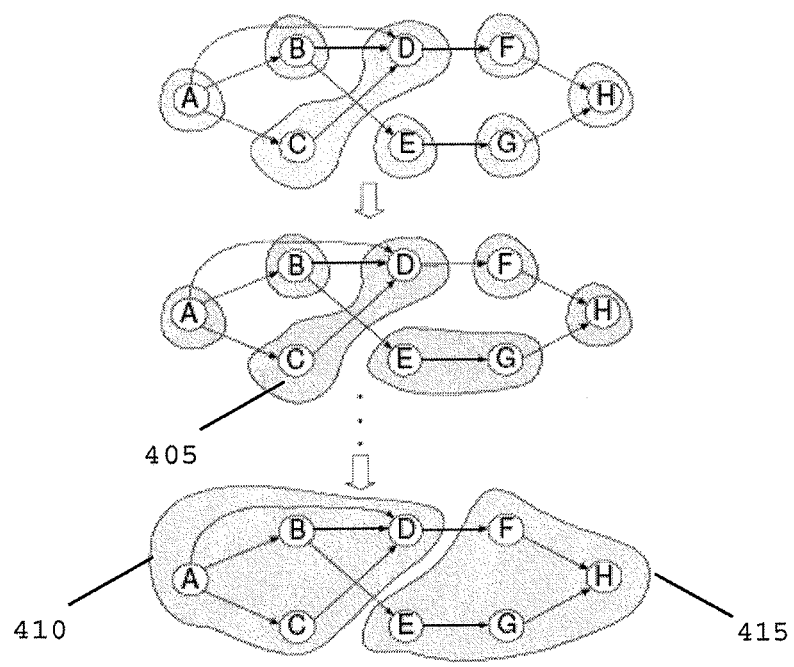
FIG. 4 is an illustration of a partitioning procedure according to certain exemplary embodiments of the present disclosure providing an iterative application flow.

According to the exemplary procedure, SCCs can be merged into larger regions. The end-result of each merge operation can potentially be the elimination of some of the interface registers, and thus saving area costs, and potentially an increase in launch or capture power. These merge operations are illustrated, for example, in FIG. 4. For example, SCCs C and D can be merged into a single region, converting the interface registers in C into non-interface registers. In the steps, the two regions whose merge can eliminate a maximum number of interface registers, can be merged, and every step can reduce the number of regions by one, as a result. Acyclicity constraint can still be met upon merge operations however. Merging two regions from consecutive levels (levelization of the graph can proceed from the SCC/region with an outdegree of 0, which can be assigned the first level. The level of any region can be one more than the maximum level of its successor regions) can preserve the acyclicity of the graph. Two regions from the same level can also be merged without introducing a cycle, yet offering no interface register savings. The final solution with two regions can be shown, for example, in the bottom of FIG. 4. This can be the same partitioning solution implemented in FIGS. 2 and 3. The steps of the procedure can offer a partitioning solution with a particular implementation cost (e.g., mostly driven by the total number of interface registers) and power reduction. The final step, for instance, can be a solution that offers minimal area cost implementation, as the interface registers are those in regions B and D. Depending upon the particular goals and constraints, one of the solutions offered by the exemplary systems, methods and computer-accessible mediums can be selected and implemented.

The exemplary steps of the exemplary iterative merge-based partitioning procedure can resemble the min-cut problem (see, e.g., Reference 21), which can be known to be an NP-Complete problem. According to certain exemplary embodiments of the present disclosure, it can be possible to utilize a custom heuristic as minimization of edges does not necessarily minimize the interface registers.

Exemplary Application Flow

The following operations can be performed in the exemplary order shown, or another order, so as to implement the proposed low-power LOS testing scheme, which can be capable of applying intact a set of LOS patterns in a low-power manner while capable of delivering identical test quality and pattern count:

- Design partitioning by utilizing the exemplary partitioning procedure for identifying the interface registers.
- Conventional scan stitching with a constraint being the positioning of the interface registers of each region, if any, in consecutive locations on the scan chain.
- LOS pattern generation by a power-unaware ATPG that can be executed on the netlist with a single scan chain (e.g., interface registers of each region together).
- Insertion of the exemplary hardware (e.g., double-stitching and a few flops) into the netlist.
- Adopting the LOS patterns generated by the power-unaware ATPG tool by manipulating launch-capture clocking, and re-using them.

Exemplary Experimental Results

It can be possible to implement the exemplary design partitioning technique for LOS testing, and apply these techniques on academic benchmark circuits (a boundary scan implementation in LOS testing can be assumed, where an additional scan cell can be inserted for each I/O in the design) to gauge the launch and capture power reductions (a simplified power model can be used where the number of transitions in scan cells can define the power value as the two strongly correlate (see, e.g., Reference 22). More elaborate and accurate models can also be used to improve the accuracy of the analysis at the expense of computational cost that can be attained as well as the area cost. For LOS testing, patterns can be generated by implementing a wrapper code around ATALANTA, and a random-fill option can be used in filling in the unspecified bits of the stimuli. Test generation can be done in a power-unaware manner, and yet the exemplary systems, methods and computer-accessible mediums can attain power reductions, while retaining fault and defect coverage intact.

In Table 1 below, exemplary power reductions attained by an exemplary implementation, experiment, and/or utilization of certain exemplary embodiments of the present disclosure in LOS testing is shown.

Columns 3-5 can provide exemplary results of an exemplary implementation of the exemplary technique tuned for maximum peak launch power reduction (the maximum reduction in peak launch power, the required area cost, and the reduction attained in peak capture power with this setting are presented in these three columns, respectively). Each of the subsequent three supercolumns provides the exemplary results when a certain level of peak launch power reduction can be targeted and attained (columns 6-7, 8-9, and 10-11 present the exemplary area cost and exemplary capture power reduction results in attaining peak launch power reductions of 30%, 20%, and 10%, respectively).

On average, a maximum peak launch power reduction of 54% can be attained at an area cost of 6.6%; the area cost, which mostly can include multiplexers utilized to double-stitch the interface registers, becomes smaller for larger benchmark circuits. As expected, higher levels of reductions can be achieved for peak capture power; peak power dissipation typically occurs during launch rather than capture.

The exemplary technique can offer less costly solutions by performing iterative merge operations, reducing the total number of interface registers. For example, to attain a 30% reduction in peak launch power, on average 3.6% area cost can be expended. For launch power reductions of 20% and 10%, the area cost can be, for example, 2.1% and 1.0% respectively. For the largest benchmark circuits, the area cost can be lower than the average area costs above, boding well for the application of the exemplary systems, methods and computer-accessible mediums on much larger industrial designs. Both launch and capture power can be reduced significantly in a cost-effective manner.

Figure 5:
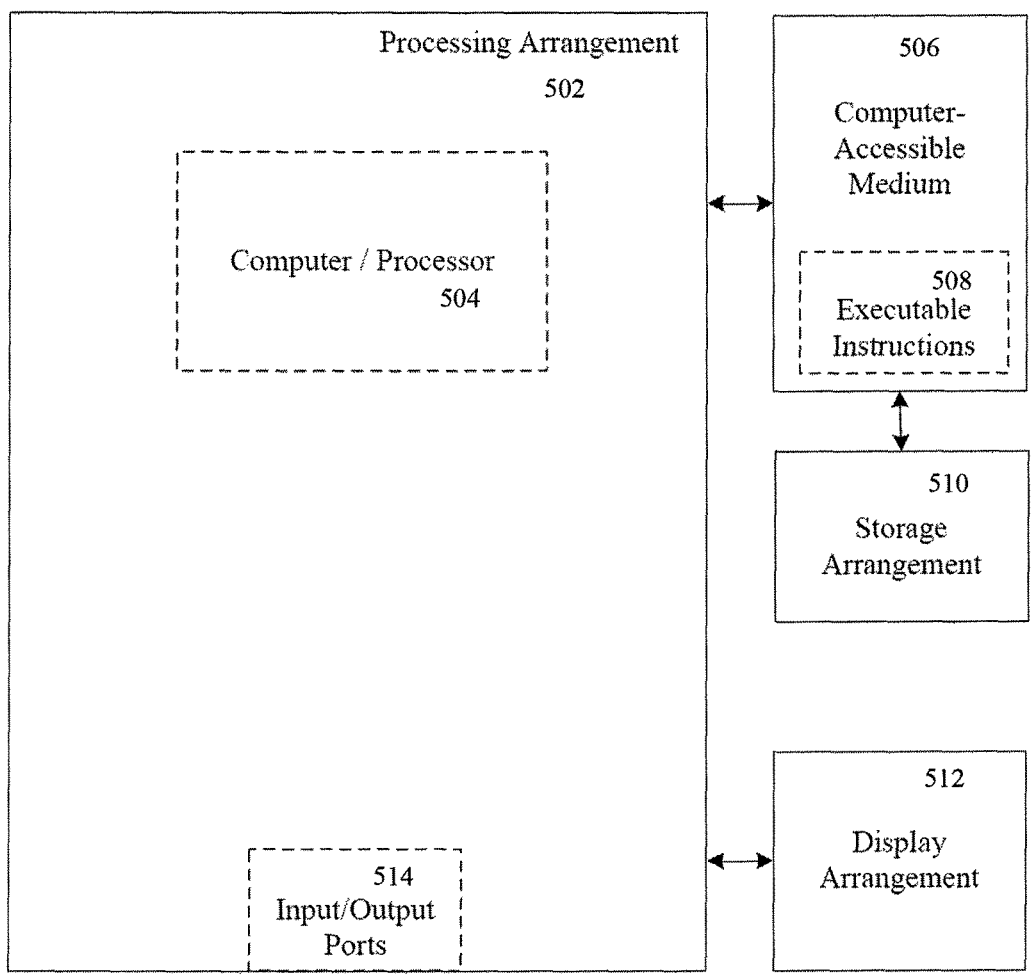
FIG. 5 is an illustration of an exemplary block diagram of an exemplary system in accordance with certain exemplary embodiments of the present disclosure.

FIG. 5 shows an exemplary block diagram of an exemplary embodiment of a system according to the present disclosure. For example, exemplary procedures in accordance with the present disclosure described herein can be performed by a processing arrangement and/or a computing arrangement 502. Such processing/computing arrangement 502 can be, e.g., entirely or a part of, or include, but not limited to, a computer/processor 504 that can include, e.g., one or more microprocessors, and use instructions stored on a computer-accessible medium (e.g., RAM, ROM, hard drive, or other storage device).

As shown in FIG. 5, e.g., a computer-accessible medium 506 (e.g., as described herein above, a storage device such as a hard disk, floppy disk, memory stick, CD-ROM, RAM, ROM, etc., or a collection thereof) can be provided (e.g., in communication with the processing arrangement 502). The computer-accessible medium 506 can contain executable instructions 508 thereon. In addition or alternatively, a storage arrangement 510 can be provided separately from the computer-accessible medium 506, which can provide the instructions to the processing arrangement 502 so as to

TABLE 1

| | | Launch and capture power reductions (LOS testing). | | | | | | | | |
|---|---|---|---|---|---|---|---|---|---|---|
| | | Maximum launch power reduction | | | 30% launch power reduction | | 20% launch power reduction | | 10% launch power reduction | |
| Circuit | Scan Cells | Launch Red. (ft) | Area (%) | Cap. Red. (%) | Area (%) | Cap. Red. (%) | Area (%) | Cap. Red. (%) | Area (%) | Cap. Red. (%) |
| s9234 | 269 | 51.7 | 7.1 | 65.8 | 4.9 | 65.8 | 4.4 | 37.2 | 1.8 | 21.9 |
| s13207 | 821 | 63.8 | 10.3 | 80.5 | 2.5 | 40.2 | 1.2 | 26.8 | 0.5 | 14.1 |
| s15850 | 698 | 33.4 | 6.1 | 58.9 | 6.1 | 58.9 | 2.5 | 27.4 | 1.1 | 15.8 |
| s35932 | 2083 | 87.4 | 7.5 | 92.5 | 2.3 | 51.5 | 2.3 | 51.5 | 0.9 | 9.6 |
| s38417 | 1770 | 64.5 | 8.9 | 87.0 | 3.0 | 66.9 | 2.6 | 26.6 | 1.3 | 16.8 |
| s38584 | 1742 | 39.7 | 5.0 | 51.2 | 5.0 | 51.2 | 0.8 | 22.0 | 0.5 | 15.1 |
| b17 | 1549 | 35.4 | 1.2 | 39.7 | 1.2 | 39.7 | 1.2 | 39.7 | 1.2 | 39.7 | configure the processing arrangement to execute certain exemplary procedures, processes and methods, as described herein above, for example.

Further, the exemplary processing arrangement 502 can be provided with or include an input/output arrangement 514, which can include, e.g., a wired network, a wireless network, the internet, an intranet, a data collection probe, a sensor, etc. As shown in FIG. 5, the exemplary processing arrangement 502 can be in communication with an exemplary display arrangement 512, which, according to certain exemplary embodiments of the present disclosure, can be a touch-screen configured for inputting information to the processing arrangement in addition to outputting information from the processing arrangement, for example. Further, the exemplary display 512 and/or a storage arrangement 510 can be used to display and/or store data in a user-accessible format and/or user-readable format.

Figure 6:
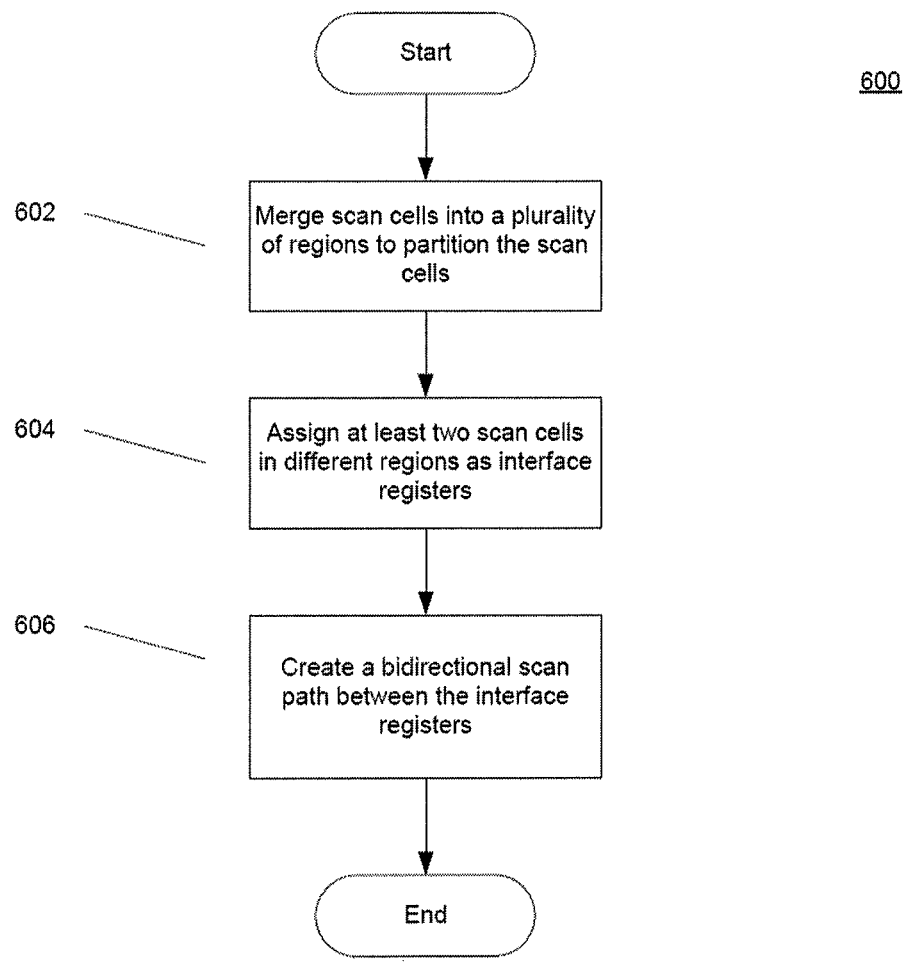
FIG. 6 is a flow diagram of an exemplary method according to certain exemplary embodiments of the present disclosure.
Figure 7:
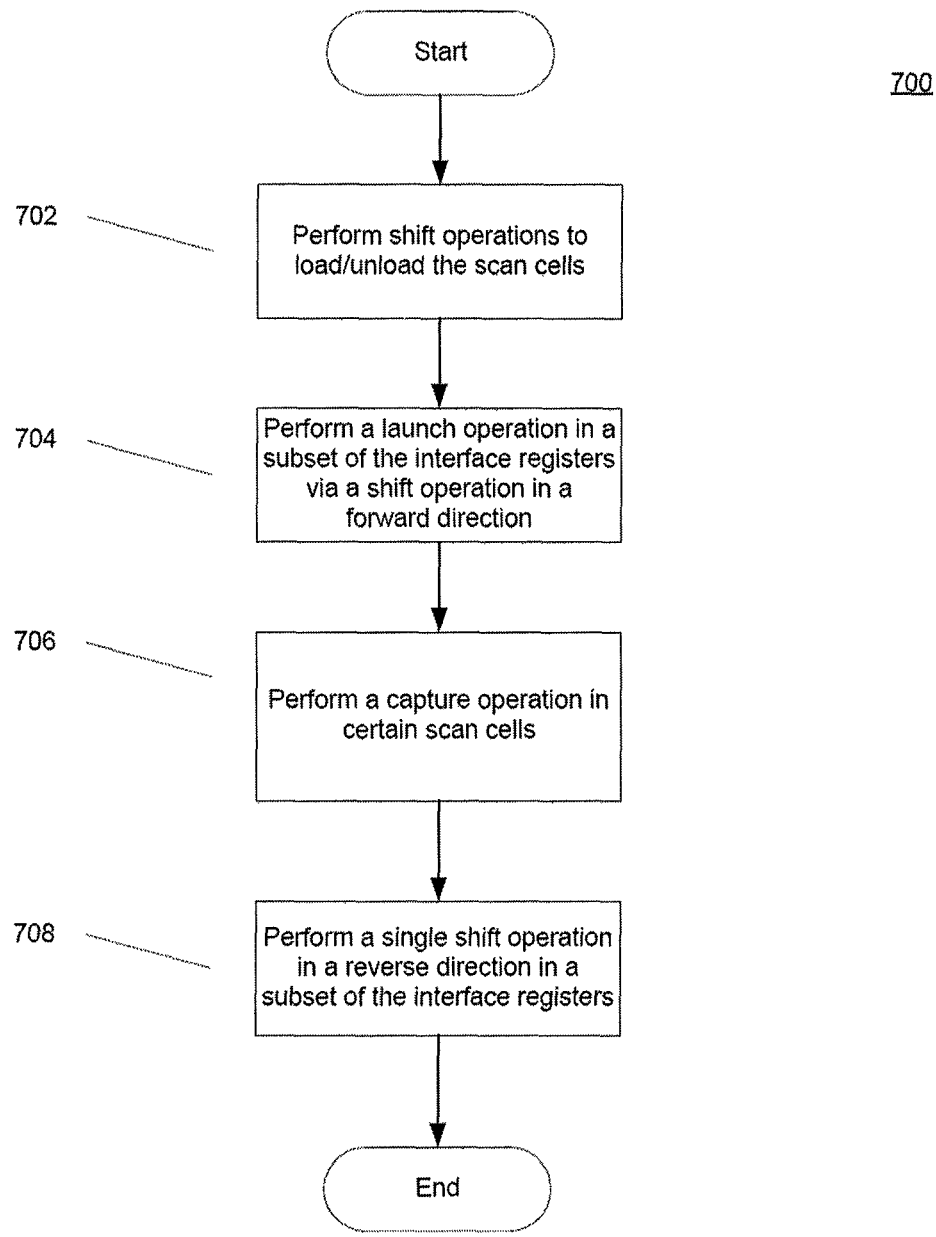
FIG. 7 is a flow diagram of the exemplary method according to further exemplary embodiments of the present disclosure.

FIG. 6 shows an exemplary process 600 for configuring a circuit for test according to certain exemplary embodiments of the present disclosure and FIG. 7 shows an exemplary method 700 for testing a circuit according to certain exemplary embodiments of the present disclosure. For example, in the exemplary method 600, scan cells can be merged so as to partition scan cells into a plurality of regions (procedure 602). Next, interface registers can be assigned in at least two neighboring scan cells (procedure 604). Subsequently, a bidirectional scan path can be created between the interface registers (procedure 606).

In another exemplary process 700, according to a further exemplary embodiment of the present disclosure, a circuit can be tested by first performing shift operations to load/unload the scan cells (procedure 702). Next, a launch operation can be performed in some of the interface registers using a shift operation in the forward direction (procedure 704). After the launch operation, a capture operation can be performed in some of the scan cells (procedure 706). A single shift operation in the reverse direction can then be performed in a subset of the interface registers (procedure 708).

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be used synonymously to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entirety.

[1] J. Savir and S. Patil, "On broad-side delay test," *IEEE Transactions on Very Large Scale Integration (VLSI) Systems*, vol. 2, no. 3, pp. 368-372, 1994.

[2] J. Savir and S. Patil, "Scan-based transition test," *IEEE Transactions on Computer-Aided Design of Integrated Circuits and Systems*, vol. 12, no. 8, pp. 1232-1241, August 1993.

[3] P. Girard, "Survey of low-power testing of VLSI circuits," *IEEE Design and Test*, vol. 19, no. 3, pp. 82-92, 2002.

[4] P. Girard, N. Nicolici, and X. Wen, "Power-aware testing and test strategies for low power devices," in *Springer*, 2010.

[5] J. Saxena, K. M. Butler, V. B. Jayaram, S. Kundu, N. V. Arvind, P. Sreeprakash, and M. Hachinger, "A case study of IR-drop in structured at-speed testing," in *International Test Conference*, 2003, pp. 1098-1104.

[6] K. M. Butler, J. Saxena, T. Fryars, G. Hetherington, A. Jain, and J. Levis, "Minimizing power consumption in scan testing: Pattern generation and DFT techniques," in *International Test Conference*, 2004, pp. 355-364.

[7] K. Agarwal, S. Vooka, S. Ravi, R. Parekhji, and A. S. Gill, "Power analysis and reduction techniques for transition fault testing," in *Asian Test Symposium*, 2008, pp. 403-408.

[8] K. Chakravadhanula, V. Chickermane, B. Keller, P. Gallagher, and P. Narang, "Capture power reduction using clock gating aware test generation," in *International Test Conference*, 2009, pp. 1-9.

[9] Zhuo Zhang, S. M. Reddy, I. Pomeranz, J. Rajski, and B. M. Al-Hashimi, "Enhancing delay fault coverage through low power segmented scan," in *European Test Symposium*, May 2006, pp. 21-28.

[10] Qiang Xu, Dianwei Hu, and Dong Xiang, "Pattern-directed circuit virtual partitioning for test power reduction," in *International Test Conference*, 2007, pp. 1-10.

[11] E. K. Moghaddam, J. Rajski, S. M. Reddy, and M. Kassab, "At-speed scan test with low switching activity," in *VLSI Test Symposium*, 2010, pp. 177-182.

[12] F. Wu, L. Dilillo, A. Bosio, P. Girard, S. Pravossoudovitch, A. Virazel, M. Tehranipoor, K. Miyase, X. Wen, and N. Ahmed, "Power reduction through x-filling of transition fault test vectors for los testing," in *International Conference on Design and Test of Integrated Systems*, 2011.

[13] P. Girard, L. Guiller, C. Landrault, and S. Pravossoudovitch, "Circuit partitioning for low power BIST design with minimized peak power consumption," in *Asian Test Symposium*, 1999, pp. 89-94.

[14] Ho Fai Ko and N. Nicolici, "Rtl scan design for skewed-load at-speed test under power constraints," in *International Conference on Computer Design*, 2006, pp. 237-242.

[15] Ho Fai Ko and N. Nicolici, "Automated scan chain division for reducing shift and capture power during broadside at-speed test," *IEEE Transactions on Computer-Aided Design of Integrated Circuits and Systems*, vol. 27, no. 11, pp. 2092-2097, 2008.

[16] Zhen Chen, Krishnendu Chakrabarty, and Dong Xiang, "Mvp: Capture-power reduction with minimum-violations partitioning for delay testing," in *International Conference on Computer-Aided Design,* 2010, pp. 149-154.

[17] N. Ahmed, M. Tehranipoor, C. P. Ravikumar, and K. M. Butler, "Local at-speed scan enable generation for transition fault testing using low-cost testers," *IEEE Transactions on Computer-Aided Design of Integrated Circuits and Systems*, vol. 26, no. 5, pp. 896-906, May 2007.

[18] G. Xu and A. D. Singh, "Scan cell design for launch-on-shift delay tests with slow scan enable," *IET Computers Digital Techniques*, vol. 1, no. 3, pp. 213-219, May 2007.

[19] F. Wu, L. Dilillo, A. Bosio, P. Girard, S. Pravossoudovitch, A. Virazel, J. Ma, W. Zhao, M. Tehranipoor, and X. Wen, "Analysis of power consumption and transition fault coverage for los and loc testing schemes," in *International Symposium on Design and Diagnostics of Electronic Circuits and Systems,* 2010, pp. 376-381.

[20] P. M. Rosinger, B. M. Al-Hashimi, and N. Nicolici, "Scan architecture with mutually exclusive scan segment activation for shift- and capture-power reduction," *IEEE Transactions on Computer-Aided Design of Integrated Circuits and Systems*, vol. 23, no. 7, pp. 1142-1153, 2004.

[21] G. Karypis et al., "Multilevel hypergraph partitioning Applications in vlsi domain," in *Technical Report, Department of Computer Science, University of Minnesota,* 1998.

[22] R. Sankaralingam, N. A. Touba, and B. Pouya, "Reducing power dissipation during test using scan chain disable," in *VLSI Test Symposium,* 2001, pp. 319-324.

What is claimed is:

1. A non-transitory computer-readable medium having stored thereon computer-executable instructions for modifying or generating at least one portion of a circuit, wherein, when a computer hardware arrangement executes the instructions, the computer arrangement is configured to perform procedures comprising:
    assigning, from the circuit, at least two scan cells as at least two interface registers, wherein the assigning includes a partitioning procedure which includes iteratively merging the scan cells of the at least one portion of the circuit into a plurality of regions; and
    generating at least one bidirectional scan path between the at least two interface registers of the at least one portion of the circuit, wherein the at least one bidirectional scan path includes a plurality of scan paths between two of the at least two interface registers of the plurality of regions which are bidirectional.

2. The computer-readable medium of claim 1, wherein the at least two interface registers are disposed in neighboring positions on at least one scan chain.

3. The computer-readable medium of claim 1, wherein the iterative merging procedure maintains an acyclicity of the regions.

4. The computer-readable medium of claim 1, wherein the iterative procedure merging includes optimizing a power consumption and area cost of the at least one portion of the circuit.

5. The computer-readable medium of claim 1, wherein the at least two interface registers are minimized using a custom heuristic.

6. The computer-readable medium of claim 1, wherein the at least one bidirectional scan path connects the at least two scan cells to one another in a bi-directional manner.

7. The computer-readable medium of claim 1, wherein the at least two scan cells include internal scan cells.

8. A circuit, comprising:
    a first interface register of scan cells;
    a second interface register of scan cells, which neighbors the first interface register; and
    a bidirectional scan path between the first and second interface registers, wherein the bidirectional scan path includes a plurality of scan paths between two further interface registers of a plurality of regions which are bidirectional;
    wherein the first and second interface registers are assigned using a partitioning procedure which includes iteratively merging the scan cells of the at least one portion of the circuit into the plurality of regions.

9. The circuit of claim 8, wherein the at least two interface registers are disposed in neighboring positions on at least one scan chain.

10. The circuit of claim 8, wherein the iterative merging procedure maintains an acyclicity of the regions.

11. The circuit of claim 8, wherein the iterative merging procedure includes optimizing a power consumption and area cost of at least one portion of the circuit.

12. The circuit of claim 8 wherein the first and second interface registers are minimized using a custom heuristic.

13. The circuit of claim 8, wherein the at least one bidirectional scan path connects the scan cells to one another in a bi-directional manner.

14. The circuit of claim 8, wherein the scan cells include internal scan cells.

* * * * *

UNITED STATES PATENT AND TRADEMARK OFFICE
CERTIFICATE OF CORRECTION

PATENT NO. : 10,203,368 B2
APPLICATION NO. : 13/735679
DATED : February 12, 2019
INVENTOR(S) : Ozgur Sinanoglu It is certified that error appears in the above-identified patent and that said Letters Patent is hereby corrected as shown below:

In the Specification

Add a paragraph to include a Statement Regarding Federally Sponsored Research, under Column 1, after the "Cross-Reference to Related Application(s)", starting on Line 14, with the following paragraph:
"STATEMENT REGARDING FEDERALLY SPONSORED RESEARCH
This invention was made with government support under grant number FA8750-11-2-0274 awarded by the Department of Defense. Therefore, the government has certain rights in the invention."

Signed and Sealed this
Seventeenth Day of January, 2023

Katherine Kelly Vidal
*Director of the United States Patent and Trademark Office*